(12) United States Patent
Sun et al.

(10) Patent No.: US 7,663,693 B2
(45) Date of Patent: Feb. 16, 2010

(54) CAMERA MODULE

(75) Inventors: Cheng-Kuang Sun, Hsinchu (TW); Kuang-Chih Cheng, Linnei Township, Yunlin County (TW); Ming-Chieh Chen, Hsinchu (TW); Kuang-Shin Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 943 days.

(21) Appl. No.: 10/791,410

(22) Filed: Mar. 1, 2004

(65) Prior Publication Data

US 2005/0190290 A1  Sep. 1, 2005

(51) Int. Cl.
*H04N 5/225* (2006.01)
(52) U.S. Cl. ..................................... 348/374
(58) Field of Classification Search ......... 348/373–376; 250/208.1
See application file for complete search history.

(56) References Cited

U.S. PATENT DOCUMENTS

| | | | | |
|---|---|---|---|---|
| 4,837,407 A * | 6/1989 | Nezu | ...................... | 174/258 |
| 5,021,888 A * | 6/1991 | Kondou et al. | ............... | 348/76 |
| 6,266,197 B1 * | 7/2001 | Glenn et al. | ............... | 359/819 |
| 7,005,310 B2 * | 2/2006 | Hanada et al. | ............... | 348/340 |
| 7,009,654 B2 * | 3/2006 | Kuno et al. | .................. | 348/374 |
| 7,046,296 B2 * | 5/2006 | Shinomiya | .................. | 348/374 |
| 7,180,546 B2 * | 2/2007 | Kobayashi | .................. | 348/374 |
| 7,423,689 B2 * | 9/2008 | Kim et al. | .................... | 348/374 |
| 2002/0057468 A1 * | 5/2002 | Segawa et al. | ............. | 358/509 |
| 2003/0025825 A1 * | 2/2003 | Nakajoh | ..................... | 348/374 |
| 2003/0124773 A1 * | 7/2003 | Hashimoto | .................. | 438/127 |
| 2003/0223008 A1 * | 12/2003 | Kim et al. | .................... | 348/340 |
| 2004/0079941 A1 * | 4/2004 | Yamazaki et al. | ............. | 257/40 |
| 2004/0109080 A1 * | 6/2004 | Chan et al. | .................. | 348/345 |
| 2004/0189862 A1 * | 9/2004 | Gustavsson et al. | ......... | 348/376 |
| 2004/0212726 A1 * | 10/2004 | Wang | .......................... | 348/374 |
| 2005/0117051 A1 * | 6/2005 | Cheng et al. | ................ | 348/374 |

* cited by examiner

*Primary Examiner*—Timothy J Henn
(74) *Attorney, Agent, or Firm*—J.C. Patents

(57) ABSTRACT

A camera module is provided. The camera module comprises: a lens; a holder having a lower portion, the holder holding the lens; a circuit board; and an image sensing and processing unit including an image sensing device and an optional signal processing device stacked on and electrically connected to the image sensing device, the image sensing and processing unit being packaged on one side of the circuit board; wherein the holder is fixed on the circuit board, the image sensing and processing unit inside the lower portion of the holder. Further, if the circuit board is a flexible circuit board, then a hard plate can be disposed on the other side of the flexible PCB corresponding to the image sensing and processing unit in order to enhance the mechanical strength.

12 Claims, 4 Drawing Sheets

CAMERA MODULE

BACKGROUND OF THE INVENTION

1. Field of the Invention

This invention generally relates to a camera module, and more particularly to a packaging structure of a camera module.

2. Description of Related Art

Digital cameras have been widely used in our daily life. Because more and more customers are purchasing the digital cameras, how to simply the packaging process is an important issue for mass production.

The cost and quality of the digital cameras partially depend on the structure and method of packaging. FIG. 1 shows a traditional camera module. As shown in FIG. 1, a traditional camera module includes a holder 100 to hold a lens member 102 on its upper portion. The holder 100 also has a lower portion. There is an image sensing device 106 such as a CMOS image sensing device on the printed circuit board (PCB) 104 and inside the upper portion of the holder 100. CMOS image sensing device 106 is connected to the PCB 104 via the conducting line 108 by wire bonding. The holder 100 is fixed on the PCB 104 via a fixing member 112. If the PCB is a flexible PCB, then a hard plate 110 can be disposed on the other side of the flexible PCB corresponding to the image sensing device 106 in order to enhance the mechanical strength.

Another conventional method is to use the ball grid array (BGA) to package the chip on the circuit board. FIG. 2 shows the cross-sectional view of the image sensing device and signal processing device packaged on the circuit board by BGA. Referring to FIG. 2, the image sensing device 196 and the signal processing device 108 are packaged on the two sides of the circuit board 104 by BGA 114 and 116. The circuit board 104 covers the bottom of the holder 100.

FIG. 3 shows the cross-sectional view of the image sensing device and signal processing device packaged on the circuit board by BGA and wire bonding. Referring to FIG. 3, the image sensing device 106 is connected to the circuit board 104 via the conducting line 110 by wire bonding. The image sensing device 106 is packaged on the circuit board 104 by BGA.

During the packaging process, the particles or dust are easy to fall to the surface of the image sensing device 106, those particles will affect the quality of the image. To prevent the particles from attaching the image sensing device, a glass cover including a glass layer 120 covers the image sensing device 106 as shown in FIG. 4.

However, the glass cover will increase the packaging cost. Further, the image sensing device 106 and the signal processing device 108 have to be packaged on the two sides of the circuit board. This packaging process is costly and complex. How to simplify the packaging structure and to prevent the particles from attaching the image sensing device 106 is an important issue to the camera module manufacturers.

SUMMARY OF THE INVENTION

An object of the present invention is to provide a camera module having a compact packaging structure to allow the image sensing device and the signal processing device stacked together to be an integrated device. Then the integrated device is packaged on the circuit board, which makes the packaging structure much simpler. In addition, the glass layer can be directly stacked on the image sensing device so that the camera module has a compact structure and is better to prevent the particles from attaching the image sensing device.

The present invention provides a camera module, comprising: a lens; a holder having a lower portion, the holder holding the lens; a circuit board; and an image sensing and processing unit including an image sensing device and an optional signal processing device stacked on and electrically connected to the image sensing device, the image sensing and processing unit being packaged on one side of the circuit board; wherein the holder is fixed on the circuit board, the image sensing and processing unit inside the lower portion of the holder.

In a preferred embodiment, the circuit board is a flexible circuit board; the present invention further comprises a hard plate disposed on the other side of the flexible circuit board corresponding to the image sensing and processing unit to enhance the mechanical strength.

The present invention provides a camera module, comprising: a lens; a holder having a lower portion and a bottom, the holder holding the lens; an image sensing and processing unit including an image sensing device and an optional signal processing device stacked on and electrically connected to the image sensing device; a plate holding the image sensing and processing unit and covering the bottom of the holder, the image sensing and processing unit being inside the lower portion of the holder; and at least a flexible circuit board electrically connected to the image sensing and processing unit.

The present invention provides a image sensing and processing unit, comprising: a signal processing device; an image sensing device stacked on and electrically connected to signal processing device; and a circuit board electrically connected to at least one of the signal processing device and image sensing device.

In a preferred embodiment, the circuit board includes a flexible circuit board, and the image sensing device is disposed on the flexible circuit board.

In a preferred embodiment, the circuit board includes a flexible circuit board.

In a preferred embodiment, the circuit board includes one or two flexible circuit boards The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 1:
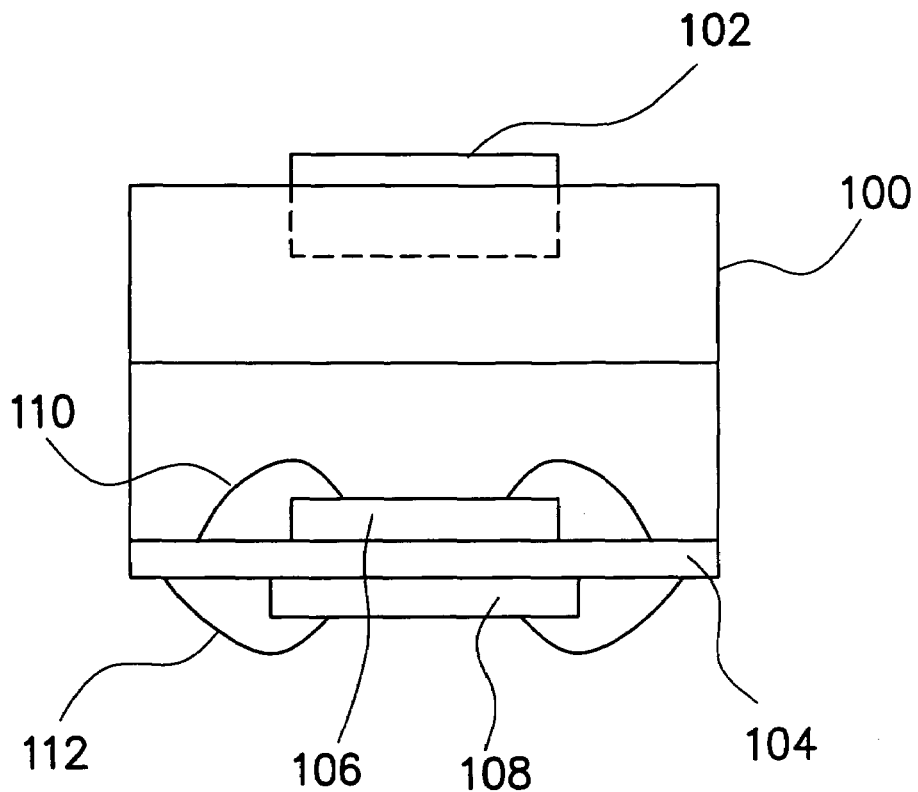
FIG. 1 shows a traditional camera module.
Figure 2:
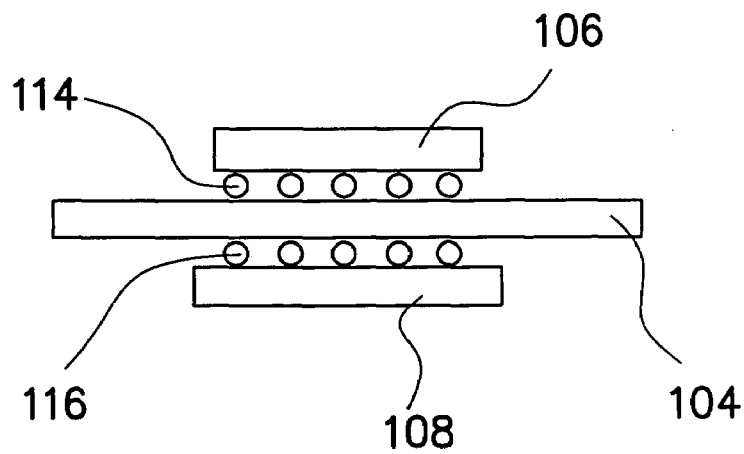
FIG. 2 shows the cross-sectional view of the conventional image sensing device and signal processing device packaged on the circuit board by BGA.
Figure 3:
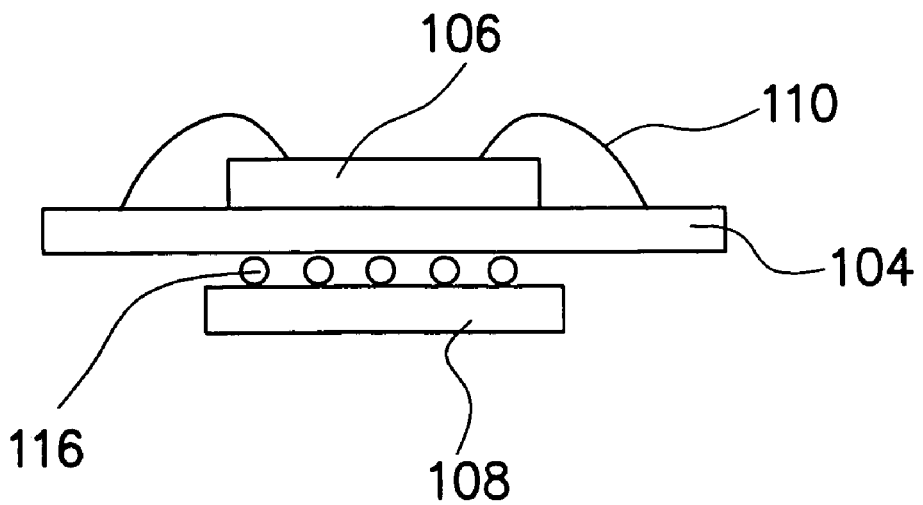
FIG. 3 shows the cross-sectional view of the conventional image sensing device and signal processing device packaged on the circuit board by BGA and wire bonding.
Figure 4:
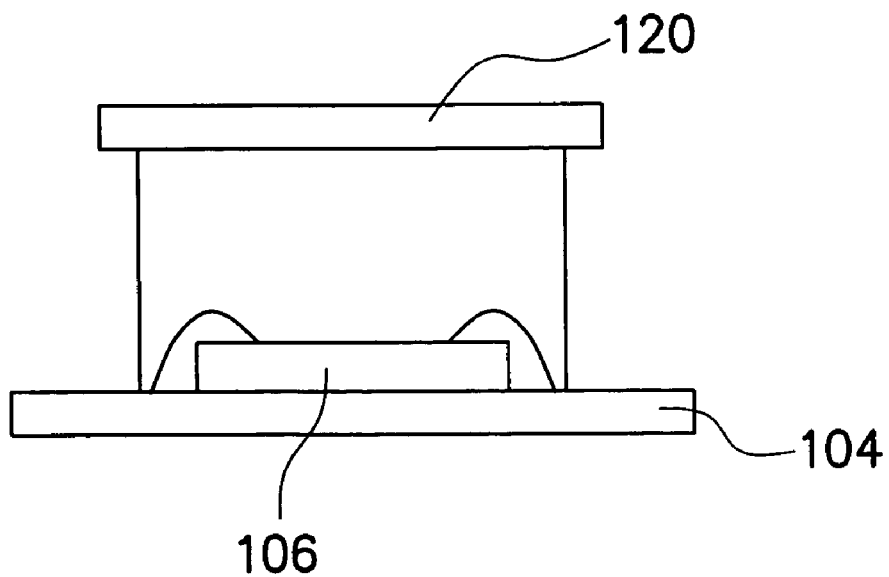
FIG. 4 shows the cross-sectional view of the conventional image sensing device and the glass cover packaged on the circuit board.
Figure 5:
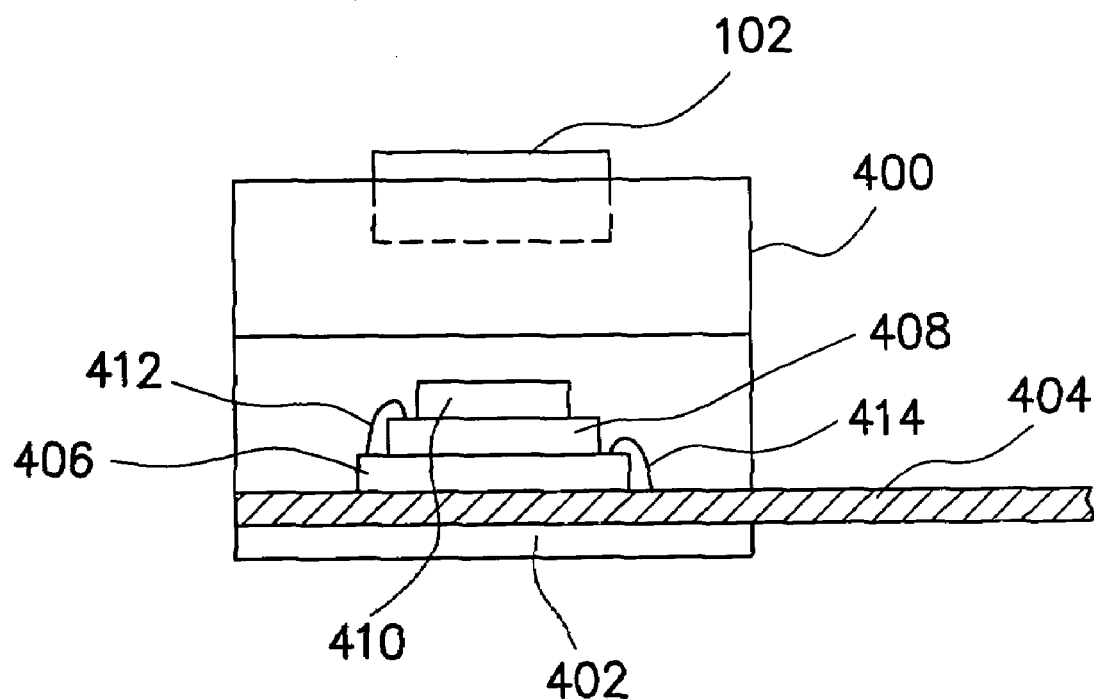
FIG. 5 shows the cross-sectional view of the camera module in accordance with a preferred embodiment of the present invention.

FIG. 5 shows the cross-sectional view of the camera module in accordance with a preferred embodiment of the present invention. The camera module comprises a lens 102, a holder 400, an image sensing device 408, a signal processing device 406, a circuit board 404, and optionally including a glass layer 410.

The lens 102 is held on the upper portion of the holder 400. The lens is used to capture the image. The image sensing device 408 and the signal processing device 406 can be accommodated inside the lower portion of the holder 400.

The image sensing device 408 is stacked on and electrically connected to the signal processing device 406 so that the image sensing device 408 the signal processing device 406 are integrated into the image sensing and processing unit. The image sensing device 408 the signal processing device 406 can be two chips stacked and are electrically connected together via appropriate connecting points. The image sensing and processing unit is electrically connected to the circuit board 404 by wire bonding via the conducting lines 412 and 414. Hence, the image sensing and processing unit has a compact packaging structure packaged on the circuit board 404. The image sensing and processing unit can include a CMOS image sensing device and optionally include a signal processing device stacked with the image sensing device.

In addition, the image sensing device 408 can be optionally directly be covered by a glass layer 410 to prevent the image sensing device 408 from contaminated by the particles. The bottom of the holder 400 is fixed on the circuit board 404, and the image sensing and processing unit can be accommodated inside the lower portion of the holder 400.

Further, the circuit board 404 can be an inflexible or flexible circuit board. If a flexible circuit board is used, a hard plate 402 can be used on the other side of the flexible circuit board 404 corresponding to the image sensing and processing unit to enhance the mechanical strength.

The present invention provides a camera module having a compact packaging structure to stack and electrically connect the image sensing device 408 and the signal processing device 406 together to be an integrated device. In addition, the glass layer 410 can be directly stacked on the image sensing device 408. The image sensing device 408 is a pixel array structure, and the signal processing device can be a digital signal processing device. In this embodiment the wire bonding is used as an example to illustrate the present invention. But the present invention is not limited to use the wire bonding to connect the device to the circuit board 404.

Figure 6:
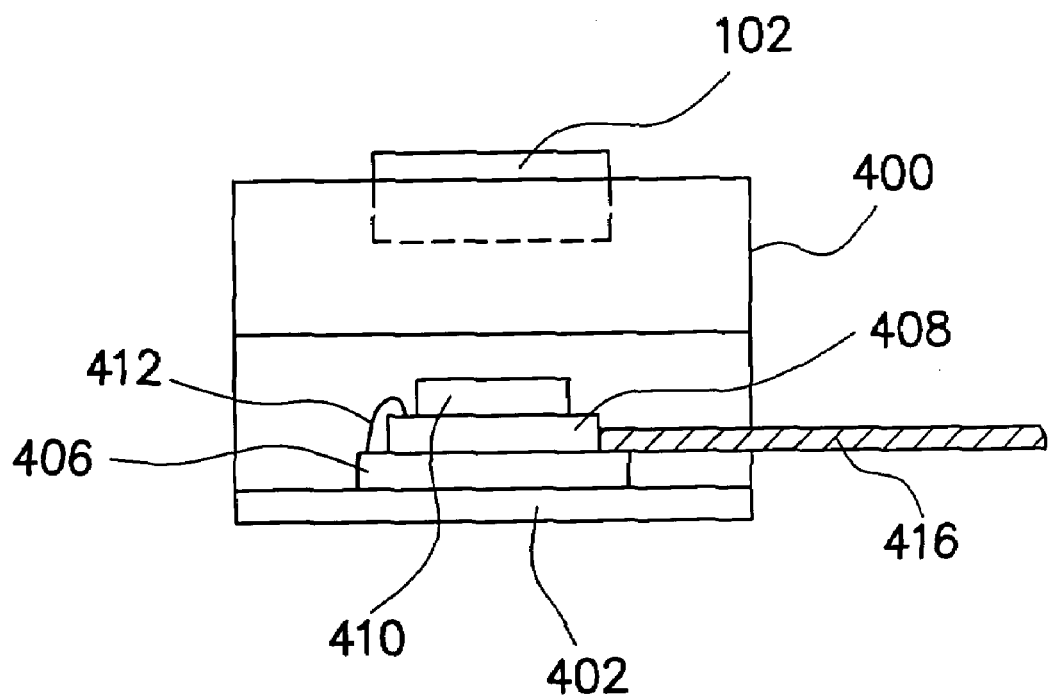
FIGS. 6 and 7 show the cross-sectional views of the camera module in accordance with the other two preferred embodiments of the present invention.

FIG. 6 shows the cross-sectional view of the camera module in accordance with another preferred embodiment of the present invention. There is another way to connect the device to the circuit board 416. For example, the circuit board 416 can be a flexible circuit board. One skilled in the art can use conventional methods to connect the device and the circuit board. Because the material of the circuit is flexible, the signal processing device 406 can be fixed on a hard plate 402. The hard plate 402 can cover the bottom of the holder 400 to form the camera module.

Figure 7:
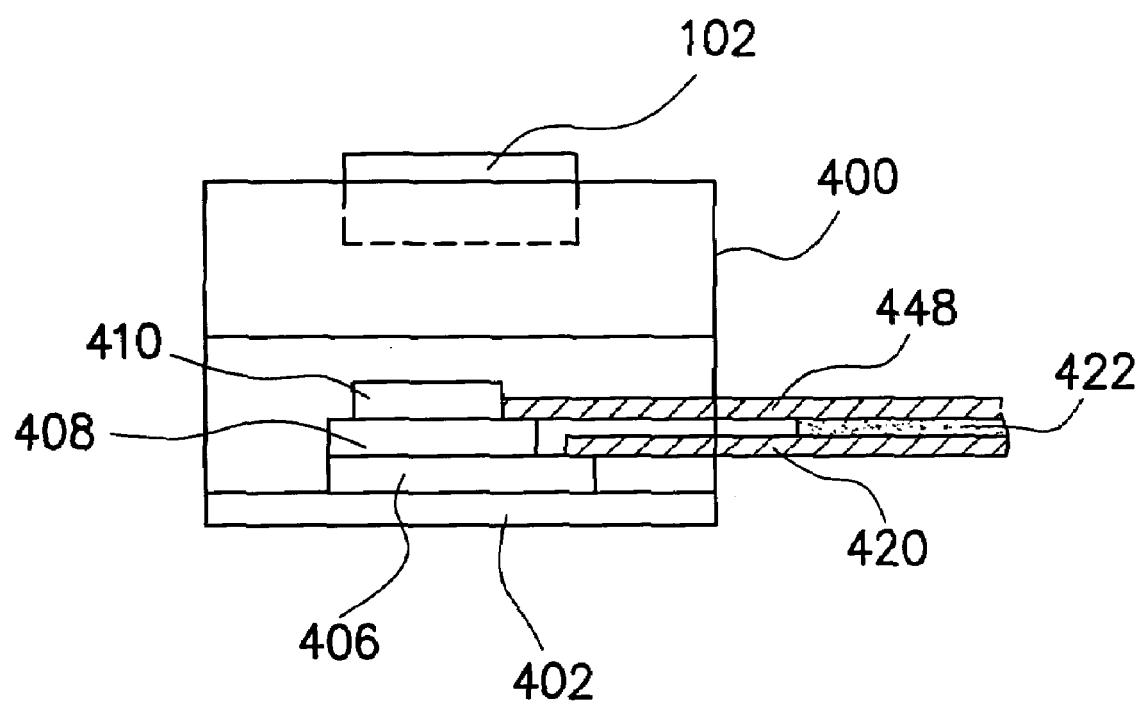

Further, the present invention can be achieved by using multiple flexible circuit boards for connecting the device. FIG. 7 shows the cross-sectional view of the camera module in accordance with another preferred embodiment of the present invention.

For example, two flexible circuit boards 448 and 420 can be electrically connected to the image sensing device 408 and the signal processing device 406 respectively. In addition, there can be a viscous layer 422 between these two flexible circuit boards 448 and 420.

Therefore, the present invention provides a camera module having a compact packaging structure to stack and electrically connect the image sensing device and the signal processing device together to be an integrated device. In addition, the glass layer can be directly stacked on the image sensing device to prevent the image sensing device from contaminated by the particles, thereby maintaining the quality of the image.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A camera module, comprising:
   a lens;
   a holder having a lower portion, said holder holding said lens;
   at least a flexible circuit board, said flexible circuit board including a first flexible circuit board and a second flexible circuit board;
   an image sensing and processing unit including an image sensing device and an optional signal processing device stacked on and electrically connected to said image sensing device, said image sensing and processing unit being packaged on one side of said flexible circuit board, and said signal processing device electrically connected to the first flexible circuit board and said image sensing device electrically connected to the second flexible circuit board;
   wherein said holder is fixed on said flexible circuit board, said image sensing and processing unit inside said lower portion of said holder; and
   a hard plate disposed on the other side of said flexible circuit board corresponding to said image sensing and processing unit.

2. The camera module of claim 1, further comprising a glass layer directly covering said image sensing device.

3. The camera module of claim 1, wherein said image sensing device is a CMOS image sensing device.

4. The camera module of claim 1, wherein said signal processing device includes a digital signal processing chip.

5. The camera module of claim 1, wherein said signal processing device and said image sensing device are electrically connected together by wire bonding.

6. A camera module, comprising:
   a lens;
   a holder having a lower portion and a bottom, said holder holding said lens;
   an image sensing and processing unit including an image sensing device and an optional signal processing device stacked on and electrically connected to said image sensing device;
   a plate holding said image sensing and processing unit and covering said bottom of said holder, said image sensing and processing unit being inside said lower portion of said holder; and
   at least a flexible circuit board directly connected to said image sensing and processing unit, wherein said flexible circuit board includes a first flexible circuit board electrically connected to said signal processing device and a second flexible circuit board electrically connected to said image sensing device.

7. The camera module of claim 6, further comprising a glass layer directly covering said image sensing device.

8. The camera module of claim 6, wherein a viscous layer is between said first flexible circuit board and said second flexible circuit board.

9. The camera module of claim 6, wherein said plate includes a plastic plate.

10. The camera module of claim 6, wherein said image sensing device is a CMOS image sensing device.

11. The camera module of claim 6, wherein said signal processing device includes a digital signal processing chip.

12. The camera module of claim 6, wherein said signal processing device and said image sensing device are electrically connected together by wire bonding.

* * * * *